United States Patent [19]
Melton et al.

[11] Patent Number: 5,561,395
[45] Date of Patent: Oct. 1, 1996

[54] METHOD AND APPARATUS FOR SELF-ADJUSTING A MULTISTAGE RADIO FREQUENCY POWER AMPLIFIER

[75] Inventors: John R. Melton, Bolingbrook; Joseph G. Schultz, Bartlett; Terence E. Sumner, Hanover Park, all of Ill.

[73] Assignee: Motorola, Inc., Schaumburg, Ill.

[21] Appl. No.: 379,707

[22] Filed: Jan. 27, 1995

[51] Int. Cl.$^6$ ................................ H03F 3/68; H03G 3/20
[52] U.S. Cl. .......................... 330/2; 330/124 R; 330/129; 330/279; 330/295
[58] Field of Search ............................ 330/2, 52, 124 R, 330/129, 279, 295

[56] References Cited

U.S. PATENT DOCUMENTS 3,845,392  10/1974  Covill .
4,794,343  12/1988  Yang ........................................... 330/2
4,937,535   6/1990  Underwood et al. ..................... 330/2 X Primary Examiner—James B. Mullins
Attorney, Agent, or Firm—Charles W. Bethards

[57] ABSTRACT

A method and apparatus (100) is for providing self adjustment of a multistage radio frequency power amplifier (RFPA) (200). The apparatus (100) includes a transmit input stage (150) and a controller (110). Included in the multistage RFPA (200) are N RFPA stages (201) coupled in parallel to an N-way RF splitter (210) and to an N-way RF combiner (220), and a power sense stage (225) which generates a forward power sense signal (167). Each of the N RFPA stages (210) includes an adjustable power amplifier (PA) (300). The controller (110) optimizes a gain match and a phase match of the multistage RFPA (200) by adjusting signals which are coupled to each adjustable PA (300). The adjustments are made in response to the forward power sense signal (167) while the controller (110) controls the test input stage (150) which generates a predetermined test signal (155).

13 Claims, 8 Drawing Sheets

METHOD AND APPARATUS FOR SELF-ADJUSTING A MULTISTAGE RADIO FREQUENCY POWER AMPLIFIER

FIELD OF THE INVENTION

This invention relates in general to RF power amplifiers and in particular to automatic phase and gain matching of parallel output stages in a radio frequency power amplifier.

BACKGROUND OF THE INVENTION

New nationwide radio communication networks, such as paging networks, are being designed which benefit from high power (greater than 1 kilowatt) transmitters having linear power amplifiers operating at carrier frequencies of approximately 1 Gigahertz. The high power output achieved in these high power amplifiers can be accomplished by using a multistage power amplifier having parallel output stages, but for maximum efficiency, the parallel stages must be phase and gain matched.

Known means of matching parallel output stages in such multistage radio frequency power amplifiers include gain and phase adjustment of the stages after final assembly of the power amplifier in the factory and after repair of one or more stages of the multistage power amplifier in the field. The gain and phase adjustment optimizes overall gain and efficiency of the power amplifier, allowing the power amplifier to meet full power output specifications without overheating. This technique can be performed manually, requiring considerable time and therefore expense. An alternative technique is to design the output stages to predetermined, precise gain and phase delay requirements. This technique, while quite successful, requires the use of precision active and passive electrical components in the parallel stages, as well as precision setting of each stage after each stage is built, during individual stage testing, which is expensive. Cables used to interconnect the stages in parallel in this alternate technique are fabricated to meet precision phase change requirements and are therefore also expensive.

Thus, what is needed is an inexpensive technique of optimizing the gain and phase matching of a multistage power amplifier.

SUMMARY OF THE INVENTION

Accordingly, in a first aspect of the present invention, a self adjusting multistage radio frequency power amplifier (RFPA) apparatus includes a multistage radio frequency power amplifier (RFPA), a transmit input stage, and a controller. The multistage radio frequency power amplifier (RFPA) includes an N-way RF splitter having a splitter input and N splitter outputs, an N-way RF combiner having N combiner inputs and a combiner output, N radio frequency power amplifier (RFPA) stages, and a power sense stage. The N RFPA stages are coupled in parallel to the N-way RF splitter and to the N-way RF combiner. Each of the N RFPA stages includes an adjustable power amplifier (PA) having a PA input coupled to one of the N splitter outputs, a PA output coupled to one of the N combiner inputs, a gain control input for adjusting an RF gain of the PA output, a phase control input for adjusting an RF phase change between the PA input and PA output, and an on-off control input for turning the PA output on and off. The power sense stage, which is coupled to the combiner output, generates a forward power sense signal based on a forward power measured at the combiner output. The transmit input stage has a low level RF output and is coupled to the splitter input. The transmit input stage generates a predetermined test signal at the low level RF output in response to a test modulation signal at a modulation input. The controller is coupled to the gain control input, the phase control input, and the on-off control input of each adjustable PA, to the modulation input of the transmit input stage, and to the power sense stage. The controller optimizes one or both of a gain match and a phase match of the multistage RFPA by adjusting one of a corresponding gain control signal and a phase control signal which are coupled to a corresponding one of the gain control input and the phase control input of each adjustable PA. The adjustments are made in response to the forward power sense signal while the controller generates the test modulation signal.

Accordingly, in a second aspect of the present invention, a method is for use in a self adjusting multistage radio frequency power amplifier (RFPA). The method is for optimizing a phase match between stages of the multistage RFPA. The self-adjusting multistage RFPA includes an N-way RF splitter, an N-way RF combiner, N RFPA stages coupled in parallel to the N-way RF splitter and to the N-way RF combiner, a power sense stage coupled to an output of the N-way RF combiner, a transmit input stage coupled to an input of the N-way RF splitter, and a controller coupled to the N RFPA stages, the transmit input stage, and the power sense stage. Each of the N RFPA stages includes an adjustable power amplifier (PA). The method includes steps of generating, identifying, selecting, turning off, and adjusting. In the step of generating, a predetermined test signal is generated which is coupled to the input of the N-way RF splitter from the transmit input stage. In the step of identifying, a first of the N RFPA stages is identified as a reference stage. In the step of selecting, a second of the N RFPA stages is selected as a test stage. In the step of turning off, a PA output of the adjustable PA of each of the N RFPA stages is turned off except the PA output of the reference and test stages. In the step of adjusting, a phase control signal coupled to a phase control input of the adjustable PA of the test stage is adjusted until a forward power sensed by the power sense stage is determined to be at a maximum value.

Accordingly, in a third aspect of the present invention, a method is for use in a self adjusting multistage radio frequency power amplifier (RFPA) stage for optimizing a gain match between stages of the multistage RFPA. The multistage RFPA includes an N-way RF splitter, an N-way RF combiner, N RFPA stages coupled in parallel to the N-way RF splitter and to the N-way RF combiner, a power sense stage coupled to an output of the N-way RF combiner, a transmit input stage coupled to an input of the N-way RF splitter, and a controller coupled to the N RFPA stages, the transmit input stage, and the power sense stage. Each of the N RFPA stages includes an adjustable power amplifier (PA) having a gain control input for adjusting a power output of the adjustable PA. The method includes the steps of generating, identifying, and setting. In the step of generating, a predetermined test signal is generated which is coupled to the input of the N-way RF splitter from the transmit input stage. In the step of identifying, a lowest power RFPA stage is identified, which generates a minimum forward power in response to the predetermined test signal. The forward power is determined from a forward power sense signal generated by the power sense stage. In the step of setting, the power output of one of the N RFPA stages is set to the minimum forward power by adjusting a gain control signal coupled to the gain control input of the adjustable PA of the one of the N RFPA stages until a forward power sensed by the power sense stage equals the minimum forward power, while the PA output of the adjustable PA of all of the N RFPA stages is turned off except the one of the N RFPA stages.

DETAILED DESCRIPTION OF THE DRAWINGS

Described herein below is a method and apparatus for automatically optimizing a phase and gain match between parallel final power amplifier stages in a multistage power amplifier. Briefly, a controller is coupled to a power sense device at the output of the multistage amplifier, to each of the parallel amplifier stages, and to a test signal generator. The controller controls the generation of a test signal and the on-off state of each parallel amplifier stage while adjusting a phase control or a gain control of one of the parallel amplifiers in response to a measurement of forward power sensed by the power sense stage to optimize the phase and gain adjustment for one stage. When all stages have been optimized, the multistage power amplifier is optimized.

Figure 1:
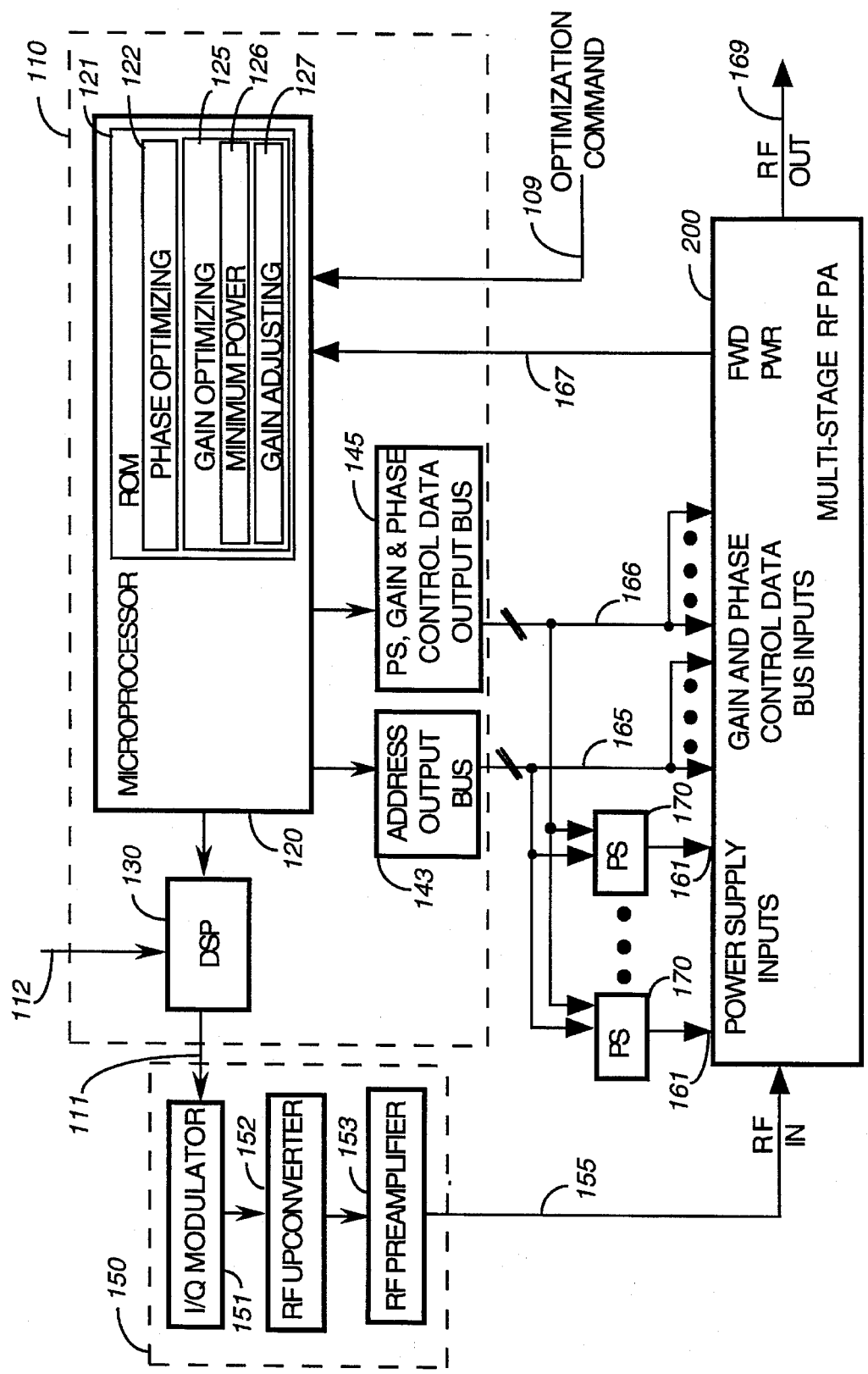
FIG. 1 is an electrical block diagram of a self adjusting multistage radio frequency power amplifier, in accordance with the preferred embodiment of the present invention.

Referring to FIG. 1, an electrical block diagram of a self adjusting multistage radio frequency power amplifier (RFPA) 100 is shown, in accordance with a preferred embodiment of the present invention. The self-adjusting multistage RFPA 100 comprises a controller 110, a transmit input stage 150, a multistage RFPA 200, and a plurality of power sources 170. The self-adjusting multistage RFPA 100 preferably generates an RF output 169 at a carrier frequency of 940 megahertz having a power of two thousand Watts peak envelope power, but the improvements provided by the present invention are also provided for RF power amplifiers having multiple parallel output stages which operate at other frequencies and power levels. The improvements are typically more significant at higher frequencies and power levels than at lower frequencies and power levels. During normal operation a signal 112 is coupled to the controller 110 from a conventional remote control site via a conventional communication link, and the controller 110 generates a normal audio modulation signal 111, which is coupled to the transmit input stage 150. The transmit stage 150 generates a low level RF signal predetermined test signal 155 which is amplified by the multistage RFPA 200 and coupled by the RF output signal 169 at the preferred carrier frequency and power level. During self adjustment of the self-adjusting multistage RFPA 100, a test modulation signal 111 is coupled from the controller 110 to the transmit input stage 150. The transmit input stage 150 generates a predetermined test signal 155, which is a low level radio frequency (RF) signal modulated by the test modulation signal 111. The preferred frequency and power of the test signal are 940 megahertz at 50 milliwatts. The predetermined test signal 155 is coupled to an input of the multistage RFPA 200. An address signal 165, a control data signal 166, and a forward power sense signal 167 are coupled from the controller 110 to the multistage RFPA 200. The forward power sense signal 167 couples a measurement of the forward power of the RF output 169 to the controller 110. The address signal 165 and the control data signal 166 are further coupled from the controller 110 to the plurality of power sources 170 for controlling an on-off state of an output of each power source 170. The outputs of the power sources 170 are coupled to power inputs 161 of the multistage RFPA 200. The multistage RFPA 200 amplifies the predetermined test signal 155 coupled from the transmit input stage 150 and generates an RF output 169, which is coupled to a conventional antenna (not shown) for broadcast transmission. An optimization command 109 is coupled as a serial signal to the controller 110 from a control device (not shown) such as a service terminal or central controller. Alternatively, a manual switch can be included in the controller 110 to generate a logic level signal as the optimization command. The optimization command 109 initiates an optimization of the self-adjusting RFPA 100.

The transmit input stage 150 comprises an in-phase/quadrature-phase (I/Q) modulator 151, an RF upconverter 152, and an RF pre-amplifier 153. The test modulation signal 111 is a two line I/Q signal coupled to the I/Q modulator 151 which generates an intermediate frequency (IF) signal, preferably at 118.5 megahertz, modulated by the test modulation signal 111. The IF signal is coupled to the RF upconverter 152, which converts the IF frequency signal to an RF signal, preferably at 940 megahertz. The RF signal is coupled to the RF pre-amplifier 153 which amplifies the RF signal preferably to 50 milliwatts, thereby generating the predetermined test signal 155 which is coupled to the multistage RFPA 200.

The controller 110 comprises a microprocessor 120, a digital signal processor (DSP) 130, an address signal output driver 143 and a control data signal output driver 145. The microprocessor 120 is coupled to the DSP 130 for controlling fire DSP 130 to modify the signal 112, generating the normal modulation signal 111 in a conventional manner during normal operation of the self-adjusting multistage RFPA 100. After the optimization command 109 has been received, the microprocessor 120 controls the DSP 130 to generate the test modulation signal 111, which is a predetermined signal such as an audio tone, during a self-adjustment process, after which the microprocessor 120 controls the DSP 130 to restore normal operation. The microprocessor 120 is further coupled to an address signal output driver 143 and a control data signal output driver 145 which convert the voltage, impedance, and timing of serial peripheral control signals generated by the microprocessor 120 to voltage, impedance, and timing characteristics appropriate for the address signal 165 and the control data signal 166 coupled to the multistage RFPA 200, which are parallel bus signals. The forward power sense signal 167 is coupled to an input port of the microprocessor 120 which records the measurement of the forward power in random access memory within the microprocessor 120. The microprocessor 120 comprises a read only memory (ROM) 121 which includes conventional program elements such as task managers and interrupt handlers for operating the controller 110, a unique phase optimizing element 122, and a unique gain optimizing element 125. The gain optimizing element 125 comprises a minimum power element 126 and a gain adjusting element 127. The minimum power element 126 determines a stage of the multistage RFPA 200 having a minimum power output when excited by the predetermined test signal 155, and the gain adjusting element 127 adjusts all stages of the multistage RFPA 200 to have the same power output when excited by the predetermined test signal 155. The phase optimizing element 122 controls the DSP 130 to generate the test modulation signal 111 and controls the outputs of the power sources 170 to be on or off while adjusting a phase of a stage of the multistage RFPA 200 for optimum phase change in a stage, in response to the forward power sense signal 167. The gain optimizing element 125 controls the DSP 130 to generate the test modulation signal 111 and controls the outputs of the power sources 170 to be on or off while adjusting a gain of a stage of the multistage RFPA 200 for optimum gain of a stage, in response to the forward power sense signal 167. The operation of the phase optimizing element 122 and gain optimizing element 125 are described more fully below.

The power source 170 is a conventional AC to DC switch-mode-power-converter which preferably accepts power from a 60 Hz AC source and converts it to a 28 Volt DC current usable by RF power transistors, and which is controlled by means of the address signal 165 and control data signal 166 for turning the output of the power source 170 on and off. The power source 170 is preferably a part number 0184906T12 power supply manufactured by Motorola, Inc., but may alternatively be any power supply having a controllable output which is compatible with the power requirements of the multistage RFPA 200, and wherein the power source 170 is compatible with control signals generated by the controller 110. For example, when an alternative controller 110 is used which generates a control signal dedicated to each power source 170, the power source can be a type which is responsive to one logic control signal.

The I/Q modulator 151 preferably comprises a part number 5182387W01 modulator manufactured by Motorola, Inc. of Schaumburg, Ill. The RF upconverter 152 preferably comprises a part number 5105329v87 upconverter manufactured by Motorola, Inc. of Schaumburg, Ill. The RF pre-amplifier 153 preferably comprises three cascaded transistors, each transistor being a part number NE85635 transistor manufactured by Nippon Electric Corp of Japan. The design and intercoupling of the I/Q modulator 151, the RF upconverter 152, and the RF pre-amplifier 153 are conventional, and alternative parts suitable for the described functions can be used.

The DSP 130 is preferably a part number 56002 DSP manufactured by Motorola, Inc. of Schaumburg, Ill.

The microprocessor 120 is preferably a member of the 68000 family of microprocessors manufactured by Motorola, Inc. of Schaumburg, Ill., having conventional firmware elements as well as the unique phase optimizing element 122 and gain optimizing element 125 stored in ROM. Alternative microprocessors can be used, and the ROM 121 can be external to the microprocessor 120. The ROM 121 can be an alternative form of non-volatile memory, such as non-volatile random access memory (NOVRAM) or battery backed up random access memory.

Each of the address signal output driver 143 and the control data signal output driver 145 preferably comprises a generic part number SN65176, which is manufactured by several manufacturers and commonly available.

Figure 2:
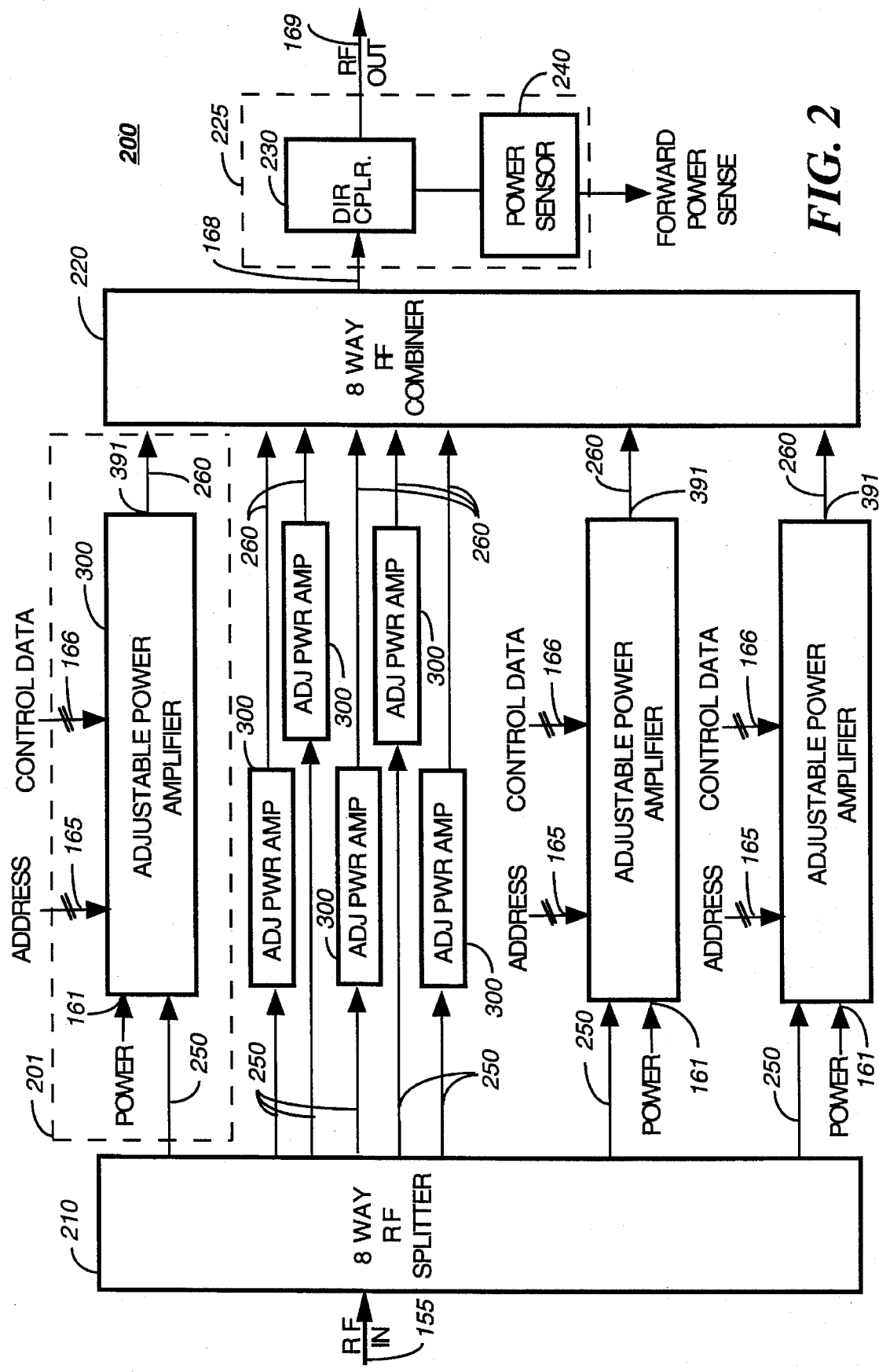
FIG. 2 is an electrical block diagram of a multistage radio frequency power amplifier (RFPA), in accordance with the preferred embodiment of the present invention.

Referring to FIG. 2, an electrical block diagram of the multistage RFPA 200 is shown, in accordance with the preferred embodiment of the present invention. The multistage RFPA 200 comprises a plurality, N, of adjustable PA's 300, N input cables 250, N output cables 260, an N-way RF splitter 210, an N-way RF combiner 220, and a power sense stage 225. It will be appreciated that in accordance with the preferred embodiment of the present invention, N is eight, but N may alternatively be any value more than one. The predetermined test signal 155 having the preferred power level of 50 milliwatts is coupled to a splitter input of the N-way RF splitter 210, and is split into N splitter RF output signals each having a power level of approximately five milliwatts in a manner well known to one of ordinary skill in the art. Each splitter RF output signal is coupled from a splitter output into an RFPA stage 201 comprising an input cable 250, a PA input 301, an adjustable PA 300, a PA output 391, and an output cable 260. Each splitter RF output signal is coupled to the PA input 301 of one of the N adjustable PA's 300 through the input cable 250. The splitter RF output signal is amplified by the adjustable PA 300 to a preferred power level of between 300 and 350 Watts peak envelope power, and coupled from the PA output 391 through the output cable 260 to one of N combiner inputs of the N-way RF combiner 220, wherein the amplified RF signals are combined into an RF output signal 168 at the combiner output, at a power level of at least 2000 Watts peak envelope power, in a manner well known to one of ordinary skill in the art. For adjustment control, each of the N adjustable PA's 300 is coupled to one of the N power sources 170 at the power input 161, and is coupled to the address signal 165, and the control data signal 166, (these couplings are illustrated for only three of the eight adjustable PA's 300 in FIG. 2).

The RF output signal 168 is coupled to the power sense stage 225, which generates the forward power sense signal 167 based on the forward power of the RF output signal 168 coupled to the power sense stage 225 in a conventional manner. A predominant portion of the RF output signal passes through power sense stage 225 as the RF output signal 169. The power sense stage 225 comprises a directional coupler 230 having a sample port coupled to a power sensor 240. The directional coupler 230 is a coaxial device which couples a small sample of the RF output signal 168 to a sample port. The RF output signal 168 is reduced in power by the small sample of power coupled to the sample port. The power sensor 240 is a diode envelope detector type with linearization and temperature compensation circuitry. The power sensor 240 generates the forward power sense signal 167 having a DC voltage proportional to the RF power level coupled from the sample port of the directional coupler 230.

The N-way RF splitter 210 is preferably a part number ZC8PD-900 splitter manufactured by Minicircuits of Brooklyn, N.Y. The N-way RF combiner 220 is preferably a part number 2782298W01 combiner manufactured by Motorola, Inc. of Schaumburg, Ill. The input and output cables 250, 260 are preferably part number Sucoflex 103 RF cables manufactured by Huber & Suhner of Essex, Vt. The input and output cables 250, 260 are relatively inexpensive cables which typically exhibit a maximum variation of 0.5 db attenuation and 100 degrees phase difference between any two pairs of input and output cables used in any pair of self-adjusting multistage RFPAs 100 at the preferred frequency of 940 megahertz. The directional coupler 230 is preferably part number DC3RL, and the power sensor 240 is preferably part number 640880, both parts manufactured by Celwave, of Marlboro, N.J.

Figure 3:
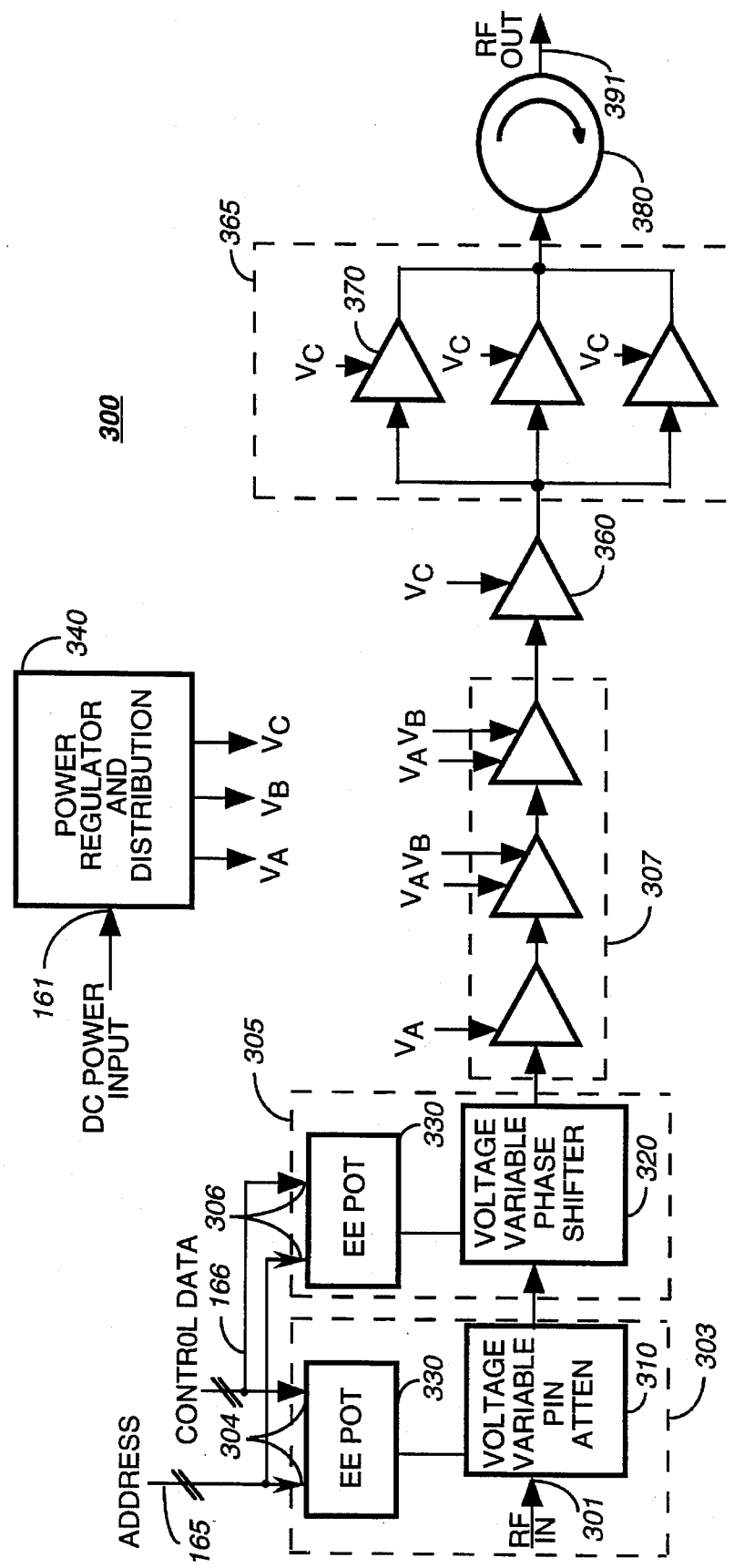
FIG. 3 is an electrical block diagram of an adjustable power amplifier, stage, in accordance with the preferred embodiment of the present invention.

Referring to FIG. 3, an electrical block diagram of the adjustable power amplifier (adjustable PA) 300 is shown, in accordance with the preferred embodiment of the present invention. The adjustable PA 300 comprises the PA input 301, the PA output 391, a power input 161, a power regulator and distribution circuit 340, a gain control circuit 303, a gain control input 304, a phase control circuit 305, a phase control input 306, a first RF amplifier stage (LOMNI amplifier) 307, a second amplifier stage (SDM amplifier) 360, a final amplifier stage 365, and an isolator 380. The gain control input 304 is for adjusting an RF gain of the PA output 391 with respect to the PA input 301. The phase control input 306 is for adjusting an RF phase change between the PA input 301 and PA output 391 and is coupled to the address signal 165 and the control data signal 166. The power input 161 provides an on-off control input for turning the PA output 391 on and off and is coupled to one of the N power sources 170. The gain control circuit 303 comprises a first programmable potentiometer 330, which is coupled to the address signal 165 and the control data signal 166, and a PIN diode 310. The first programmable potentiometer 330 is responsive to a first predetermined address in the address signal 165 for adjusting a setting of the gain control circuit 303 over a minimum range of 30 db as determined by data coupled to the first programmable potentiometer 330 simultaneously with the first predetermined address, thereby generating a first DC current control signal which is coupled to the PIN diode 310. The PIN diode 310 attenuates the RF signal coupled to the PA input 301 in proportion to the first DC current control signal. The phase control circuit 305 comprises a second programmable potentiometer 330, which is coupled to the address signal 165 and the control data signal 166. The second programmable potentiometer 330 is responsive to a second predetermined address in the address signal 165 for adjusting a setting of the phase control circuit 305 over a minimum range of ±180 degrees as determined by data coupled to the programmable potentiometer 330 simultaneously with the second predetermined address, thereby generating a second DC voltage control signal which is coupled to a voltage variable phase shifter (varactor diode) 320. The varactor diode 320 is coupled to PIN diode 310 and is responsive to the signal attenuated by the PIN diode 310 for changing the phase of the attenuated signal in proportion to the second DC current control signal. The varactor diode is coupled in series through the LOMNI amplifier 307, the SDM amplifier 360, and the final amplifier 365 which amplify the phase and gain controlled signal. The amplified phase and gain controlled signal is coupled through an isolator 380 to the PA output 391. The isolator 380 provides a 50 ohm output impedance of the adjustable PA 300 when the output is turned off. The power input 161 couples power supplied from one of the N power sources 170 to the power regulator and distribution circuit 340, which generates three regulated voltages VA, VB, and VC which are coupled to the gain control circuit 303, the phase control circuit 305, the LOMNI amplifier 307, the SDM amplifier 360, and the final amplifier stage 365 for supplying power thereto. When a power source 170 is shut off under control of the controller 110, the regulated voltages VA, VB, and VC are shut off and essentially no RF signal is coupled from the PA output 391. The overall nominal gain of the adjustable PA 300 is preferably 47 dB and is controllable by the gain control circuit 303 from 21 dB to 51 dB.

The voltage variable diode 310 is preferably a part number MMBV3401LT1 PIN diode manufactured by Motorola, Inc. of Schaumburg, Ill. The first and second programmable potentiometers 330 are preferably part number DS1267SN-10 manufactured by Dallas Semiconductor of Dallas, Tex. The varactor diode 320 is preferably a part number MMBV105GLT1 manufactured by Motorola, Inc. of Schaumburg, Ill. The LOMNI amplifier 307 preferably comprises three transistors coupled in series on a TLF7410A kit manufactured by Motorola, Inc. of Schaumburg, Ill. The SDM amplifier 360 preferably comprises a pair of SRFM33P71 transistors manufactured by Motorola, Inc. of Schaumburg, Ill., coupled in a push-pull class AB configuration. The final amplifier stage 365 preferably comprises three dual device modules (DDM) 370, each comprising four SRFM33P71 transistors manufactured by Motorola, Inc. of Schaumburg, Ill., paired into two push-pull class AB configurations. The isolator 380 preferably comprises a part number LC140C three-port ferrite junction circulator configured in a two-port isolator configuration with one port terminated into a 50 ohm power load manufactured by Alcatel Ferrocom, of San Jose, Calif. The output of the isolator is the PA output 391, which is available at a coaxial connector.

It will be appreciated that an alternative on-off control input comprises the gain control circuit 303 when set to a minimum value, preferably zero, to reduce the power coupled to the PA output to a relatively negligible amount, such as 30 db below the amount generated at the maximum setting. It will be further appreciated that alternative means of coupling gain and phase controls from the controller 110 to the adjustable PA 300 are possible, such as generating an analog control signal in the controller 110, which is either directly coupled to a gain control element such as the PIN diode 310 or a phase control element such as the varactor diode 320, or which is filtered and/or voltage scaled before such coupling to control elements in the adjustable PA 300. The alternative means for phase and gain control given as examples typically suffer from more noise and drift sensitivity than the preferred means.

Figure 4:
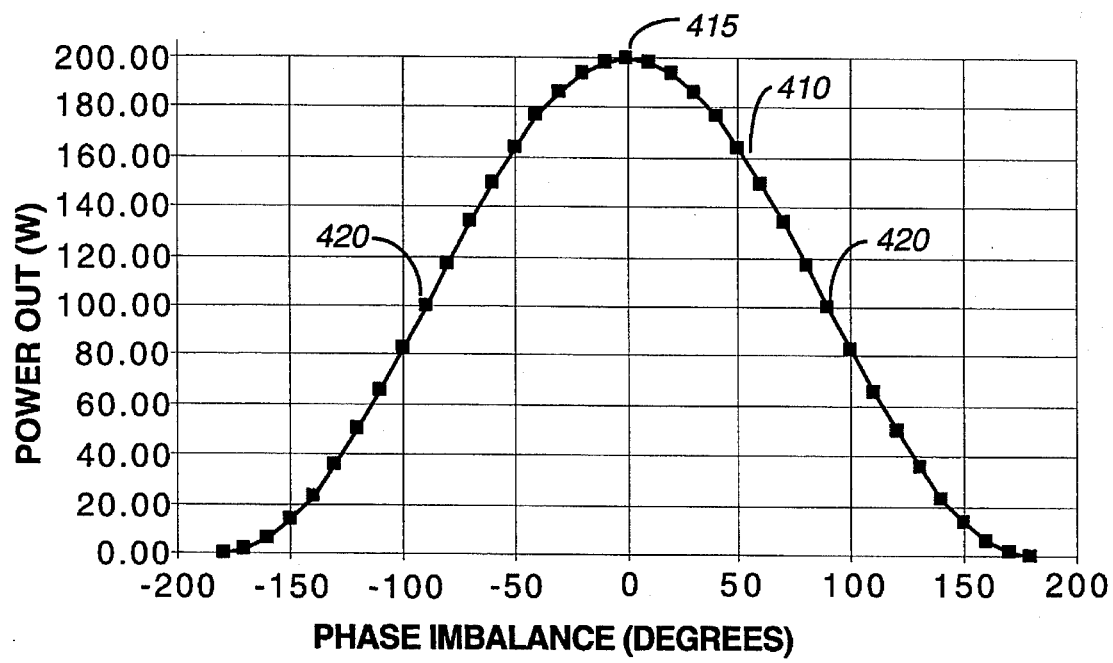
FIGS. 4 and 5 are graphs showing a forward power output versus phase difference characteristic of two stages of the multistage RFPA shown in FIG. 2 in accordance with the preferred embodiment of the present invention.
Figure 5:
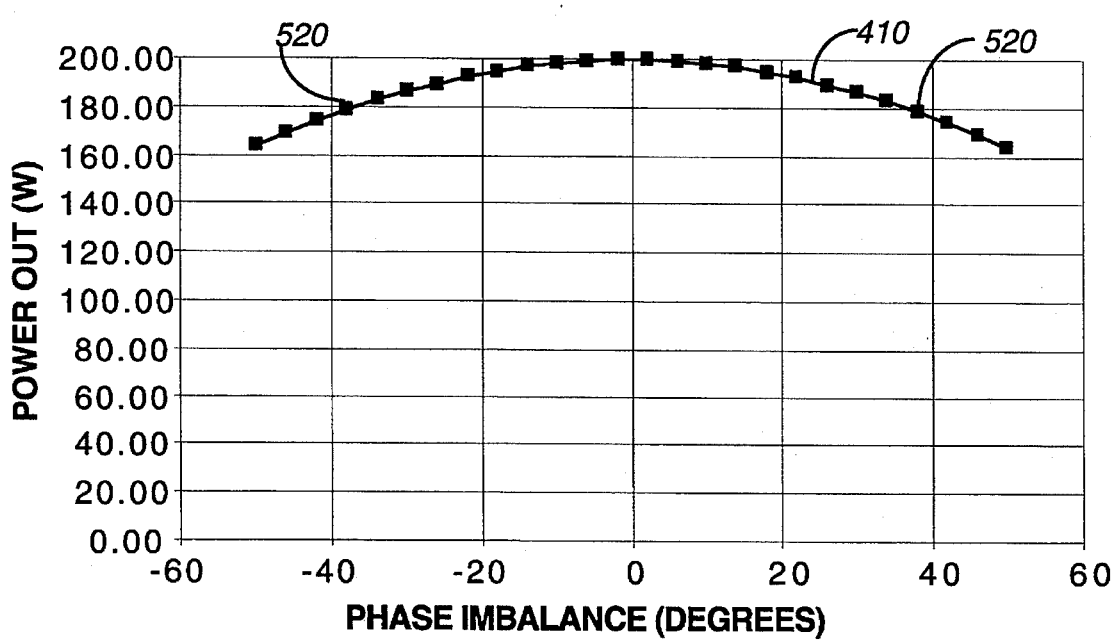

Referring to FIGS. 4 and 5, graphs are shown illustrating a forward power output versus phase difference characteristic 410 of two exemplary stages of the multistage RFPA shown in FIG. 2 in accordance with the preferred embodiment of the present invention. The phase difference characteristic 410 includes a peak power 415 of two hundred watts at a phase difference of zero degrees and includes half (3 db down) power points 420 (FIG. 4) at phase differences of approximately plus and minus ninety degrees. Also included in the phase difference characteristic 410 are 180 watt power points 520 (FIG. 5) at phase differences of approximately plus and minus 37 degrees. It will be appreciated that, using the preferred parts described above, the phase difference between any two RFPA stages 201 can be as much as 360 degrees. When two stages having phase differences are included in the self-adjusting RFPA 100, less than optimum output power is generated. Power output is optimized by adjusting the phases of all the RFPA stages 201 to have a minimum phase difference, for example less than 9 degrees (which results in a power ratio of approximately 0.2 db), and adjusting the power output of all the RFPA stages 201 to be substantially identical, for example, within 3% (which is equivalent to a power ratio of approximately 0.2 db). Adjustment of the phase difference between two RFPA stages 201 can provide a peak power, such as the peak power 415, but the adjustment is over a fairly small power range near the peak power 415, and the changes induced by adjustment can be either positive or negative, depending on which side of the peak a change is made. In contrast to the adjustment of phase difference, the RF power output for each self adjustable PA 300 versus gain control level is characteristically monotonic, and adjustment for optimization of the power output is practical when using only one of the RFPA stages

201. It will be appreciated that the adjustment of the adjustable PA 300 in each RFPA stage 201 for optimization of power output of the self-adjusting RFPA 100 compensates not only for variances between adjustable PA's 300, but also between the input cables 250 and between the output cables 260 of each stage. As noted above, the variances between two pair of the input and output cables 250, 260 are 0.5 db of attenuation and 100 degrees of phase difference. From FIG. 5, the power output at 100 degrees phase difference is approximately 80 watts, so the power loss is approximately 4.0 db. The power loss of 0.5 dB due to the attenuation imbalance of a pair of cables is negligible, but the power loss due to phase mismatch is not negligible and is not compensated for in prior art methods of power amplifier adjustment, which rely on precision stage adjustments made in the factory before the amplifiers are assembled together or used as replacements during field repairs. Thus, prior art multistage amplifiers would typically be designed to use very expensive, precision matched cables instead of the cables used in the preferred embodiment of the present invention, which are relatively inexpensive.

Figure 6:
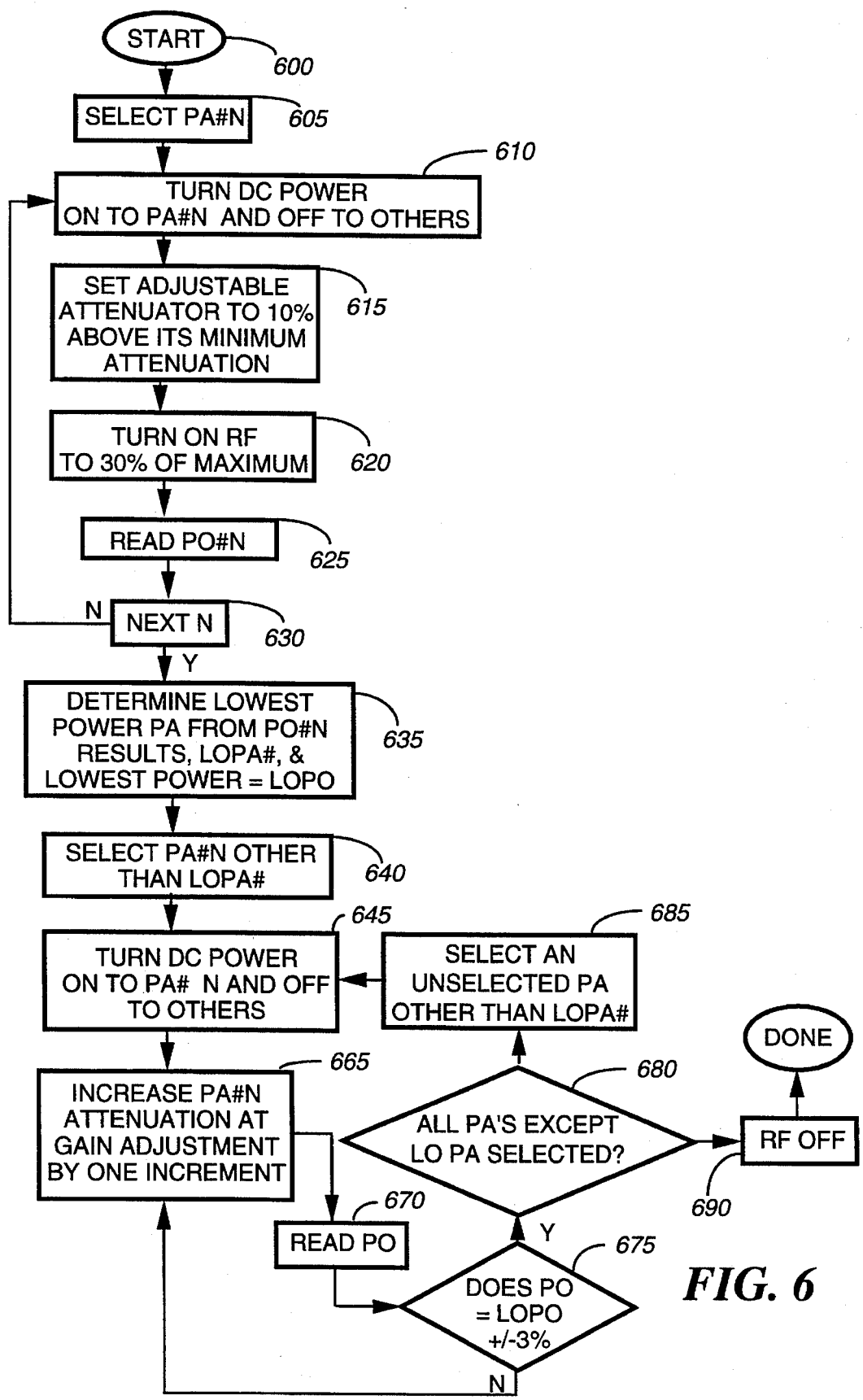
FIG. 6 is flow chart of a method used in the self adjusting multistage RFPA for optimizing a gain match between stages of the self adjusting RFPA, in accordance with the preferred embodiment of the present invention.

Referring to FIG. 6, flow chart of a method used in the self adjusting multistage radio frequency power amplifier (RFPA) 100 for optimizing a gain match between stages of the self adjusting RFPA 100 is shown, in accordance with the preferred embodiment of the present invention. The gain optimizing element 125 controls the steps of the method for optimizing the gain match. The minimum power element 126 comprises steps 605 to 635 and the gain adjusting element 127 comprises steps 640 to 690. At step 600, an optimization command is received at the controller 110, the normal RF input signal is disabled, and gain optimization is started at step 605, wherein the first of N adjustable PA's 300 is selected by the controller 110. Next, at step 610 the controller generates an on-off control signal for the selected adjustable PA 300 which turns on the PA output 391 of the selected adjustable PA 300 and generates on-off control signals for the other adjustable PA's 300 which turn off the PA outputs 391 of the other adjustable PA's 300. Next, a gain control signal is generated by the controller 110 and coupled to the gain control circuit 303 of the selected adjustable PA 300 by the address signal 165 and the control data signal 166 at step 615. The gain control signal adjusts the gain control circuit to 10% of the maximum level ("10% above its minimum level" in FIG. 6) of the gain control circuit 303. Next, the predetermined test signal 155 ("RF" in FIG. 6) is set at step 620 to 30% of a maximum input power specified for the multistage RFPA 200. Next, a power output of the PA output 391 is measured by the power sense stage 225 and recorded in the controller 110 in association with the selected at step 625, and the predetermined test signal 155 is turned off. Next, at step 630, when all of the N adjustable PA's 300 have not been selected for power output recording, a next one of the N adjustable PA's 300 not previously selected at step 630 is selected by the controller 110. Otherwise, the method is continued at step 635 by determining a minimum power, LoPA, of the recorded at step 625 for all of the N adjustable PA's 300. Also at step 635, the adjustable PA 300 associated with the minimum power is designated as LoPO in the controller 110.

Next, an adjustable PA 300 other than LoPA# is selected by the controller 110 at step 640. Next, at step 645 the controller 110 generates an on-off control signal for the selected adjustable PA 300 which turns on the PA output 391 of the adjustable PA 300 selected at step 640 and generates the on-off control signals for the other adjustable PA's 300 which turn off the PA outputs 391 of the other adjustable PA's 300. Next, the gain of the selected adjustable PA 300 is increased by the controller 110 at step 665 by adjusting the gain control circuit 303 by one increment. One increment is a predetermined minimum practical adjustment value. Next, the RF power, PO, at the PA output 391 is measured by the power sense stage 225 at step 670 and when PO is determined by the controller 110 to be not equal to LoPO within 3% at step 675 the gain is again adjusted at step 665. At step 675 when PO is determined by the controller 110 to be equal to LoPO within 3% (approximately 0.2 db), and when all adjustable PA's 300 other than LoPA# have been determined to not have been selected at step 680, one of the N adjustable PA's 300 not previously selected at step 685, other than the LoPA#, is selected at step 685. However, when all adjustable PA's 300 other than LoPA# have been determined to have been selected at step 680, the predetermined test signal is turned off and normal operation is restored at step 690.

Figure 7:
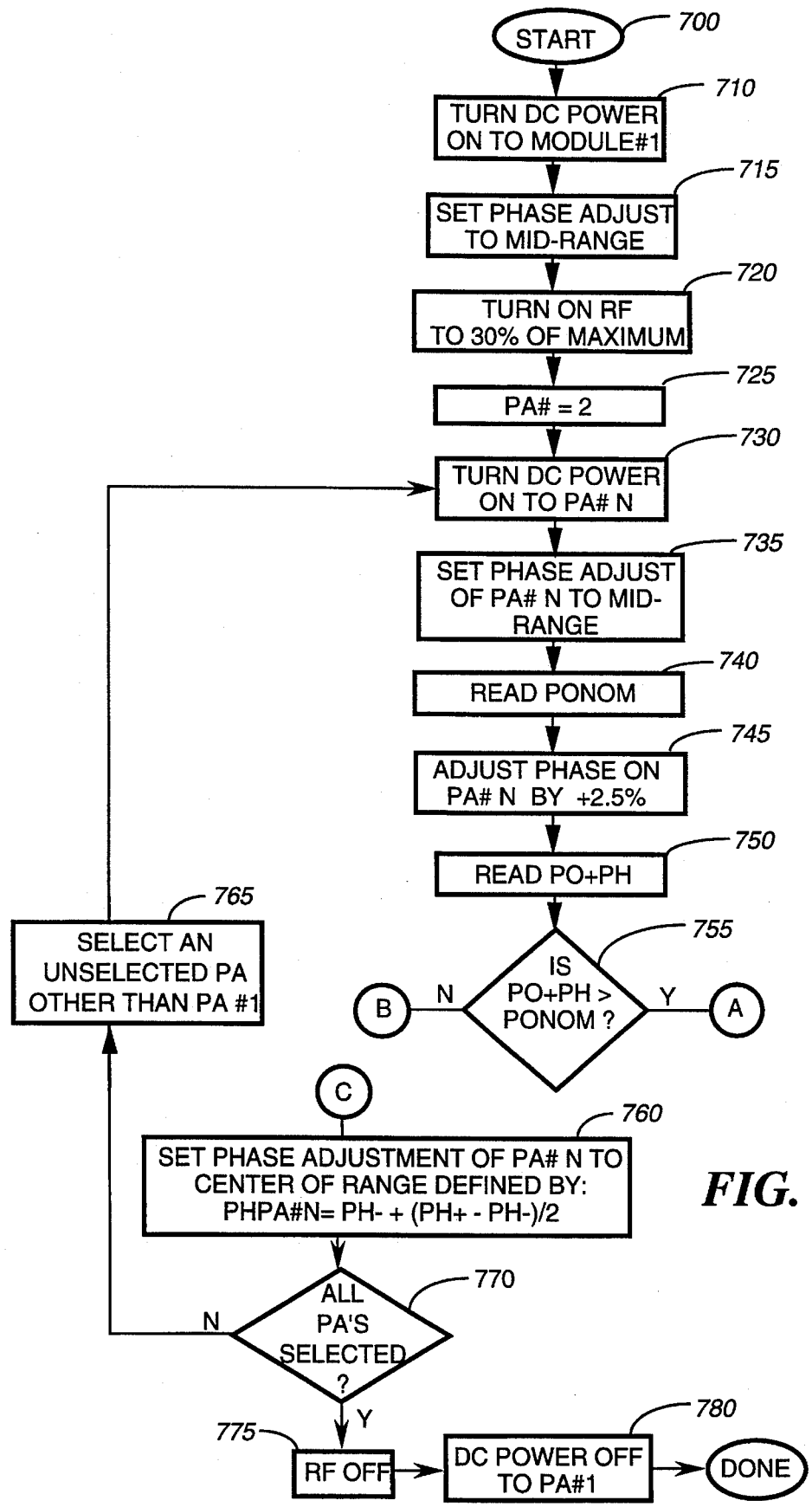
FIGS. 7–9 are a flow chart of a method used in the self adjusting RFPA for optimizing a phase match between stages of the self adjusting RFPA, in accordance with the preferred embodiment of the present invention.
Figure 8:
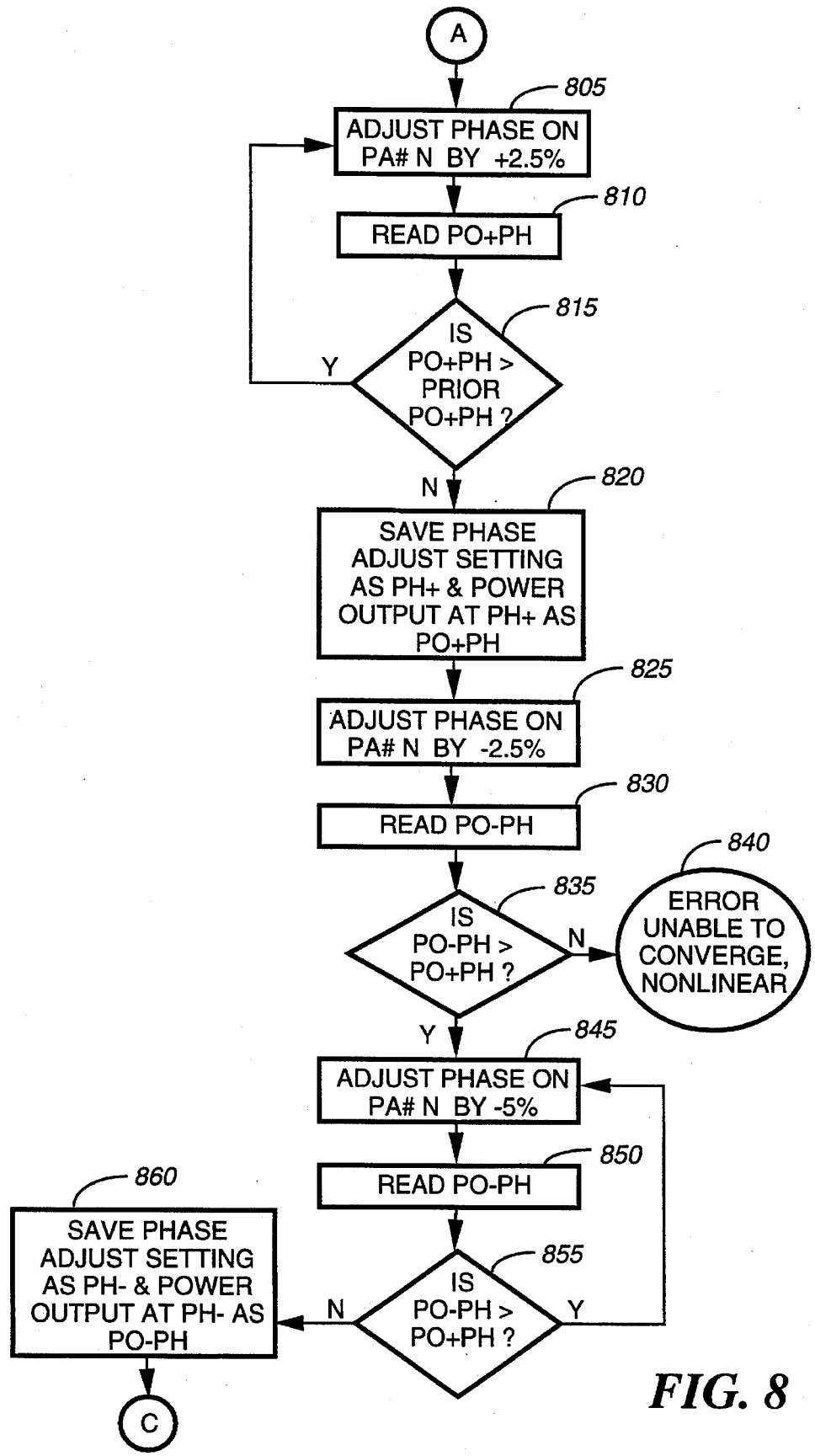
Figure 9:
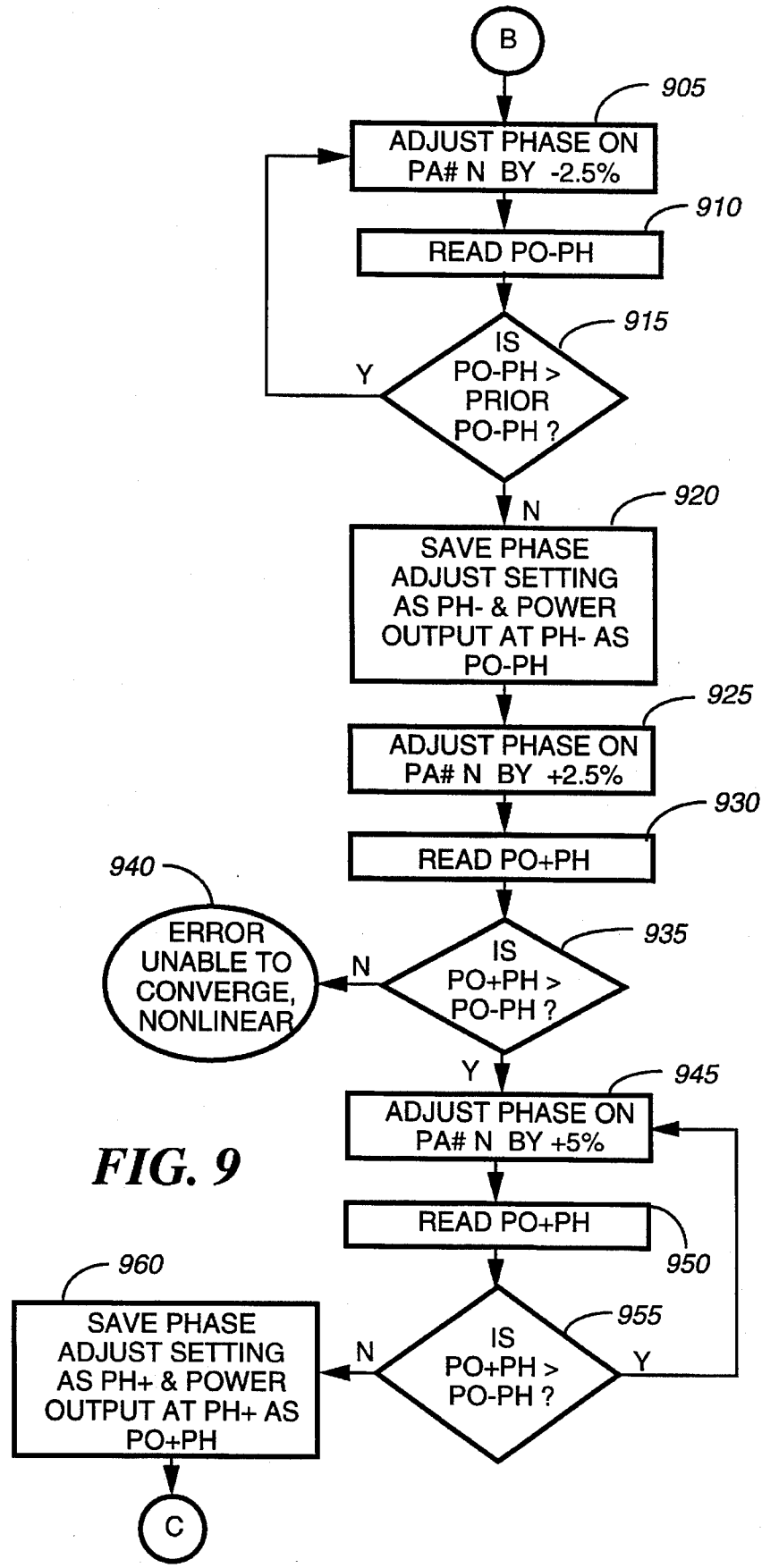

Referring to FIGS. 7–9 a flow chart of a method used in the self adjusting multistage radio frequency power amplifier (RFPA) 100 for optimizing a phase match between stages of the self adjusting RFPA 100 is shown, in accordance with the preferred embodiment of the present invention. The phase optimizing element 122 controls the steps of the method for optimizing the gain match. At step 700, an optimization command 109 is received as the controller 110, the normal RF input signal is disabled, and phase optimization is started. Next, the first of the N adjustable PA's 300 is selected at step 710 as a reference stage. Next, the controller 110 generates an on-off control signal for a first adjustable PA 300 which turns on the PA output 391 of the adjustable PA 300 selected at step 605 and generates an on-off control signal for the other adjustable PA's 300 which turns off the PA outputs 391 of the other adjustable PA's 300 at step 710. Next, a phase control signal is generated by the controller 110 which sets the phase control circuit 305 of the first adjustable PA to mid-range at step 715. The phase control signal is coupled to the phase control circuit 305 by the address signal 165 and the control data signal 166. Next, the predetermined test signal 155 ("RF" in FIG. 7) is set by the, controller 110 at step 720 to 30% of the maximum input power specified for the multistage RFPA 200. Next, one of the N adjustable PA's 300 other that the first adjustable PA 300 is selected by the controller 110 at step 725 as a second adjustable PA 300, or test stage. Next, at step 730 the controller 110 generates an on-off control signal for the second selected adjustable PA 300 which turns on the PA output 391 of the second selected adjustable PA 300 and generates on-off control signals for the other adjustable PA's 300 which turn off the PA outputs 391 of the other adjustable PA's 300 except the first adjustable PA 300. Next, at step 735 the controller generates a phase control signal which sets the phase control circuit 305 of the second adjustable PA 300 to mid-range. Next, the power level of the PA output 391 is measured by the power sense stage 225 and recorded in the controller 110 (the measuring and recording is hereafter referred to as "read") as POnom at step 740. Next, at step 745 the controller 110 generates a phase control signal which increments the setting of the phase control circuit 305 of the second adjustable PA 300 up by a first predetermined increment, which is 2.5% of the maximum setting in accordance with the preferred embodiment of the present invention. The maximum setting is approximately 360% of phase change, so the preferred increment is approximately 9 degrees. Next, at step 750, the power level of the PA output 391 (hereafter referred to as the "power output") is read as a new PO+ph.

Next, when the new PO+ph is determined by the controller 110 to be greater than or equal to POnom at step 755, the new PO+ph is stored in the controller 110 as a prior PO+ph and the setting of the phase control circuit 305 of the second adjustable PA 300 is incremented up again at step 805 (FIG. 8) by the first predetermined increment. Next, the power output is read as a new PO+ph by the controller 110 at step 810, and when the new PO+ph is determined by the controller 110 to be greater than or equal to the prior PO+ph at step 815, the new PO+ph is stored as the prior PO+ph and the setting of the phase control circuit 305 is incremented up again by the first predetermined amount at step 805. When the new PO+ph is determined by the controller 110 to be less than the prior PO+ph at step 815, the power output is read as PO+ph and a value of the control data 166 which sets the phase control circuit to generate PO+ph is stored in the controller 110 as PH+ at step 820. Next, the setting of the phase control circuit 305 of the second adjustable PA 300 is incremented down at step 825 by the first predetermined increment, and the power output is read as a new PO−ph at step 830. Next, when the new PO−ph is determined by the controller 110 to be less than PO+ph at step 835, the method is stopped and an error, "unable to converge" is stored in the controller 110 for later reference. When the new PO−ph is determined by the controller 110 to be greater than or equal to PO+ph at step 835, the setting of the phase control circuit 305 of the second adjustable PA 300 is incremented down at step 840 by twice the predetermined increment, which is 5% of the maximum in accordance with the preferred embodiment of the present invention. Next, the power output is read as a new PO−ph at step 850. Next, when the new PO−ph is greater than PO+ph at step 855, the setting of the phase control circuit 305 is incremented down again by the second predetermined amount at step 845. When PO−ph is less than or equal to PO+ph at step 855, the power output is read as PO−ph and a value of the control data 166 which sets the phase control circuit to generate PO−ph is stored in the controller 110 as PH− at step 860.

Next, the controller 110 determines an optimum setting, PHPA#N, of the phase control circuit 305 by PHPA#N=PH−+(PH+−PH−)/2 at step 760 (FIG. 7), wherein #N is indicative of which adjustable PA is selected as the second adjustable PA (e.g., PHPA4 indicates that the second adjustable PA 300 is identified as PA#4). At the optimum setting, the power output is substantially equivalent to a maximum value attainable for the pair of adjustable PA's 300 being adjusted. The controller 110 also generates a phase control signal at step 760, wherein the control data value is PHPA#N, which adjusts the second adjustable PA 300 to an optimum power level. When all adjustable PA's 300 have not been selected as first or second adjustable PA's 300 at step 770, an adjustable PA 300 which has not been previously selected during this optimization process is selected as the second adjustable PA 300 at step 765, and the method is continued at step 730. When all adjustable PA's 300 have been selected as first or second adjustable PA's 300, at step 770, the controller 110 turns off the predetermined test signal 155 at step 775 and the controller 110 generates on-off control signals for all adjustable PA's 300 which turns off all adjustable PA's 300 at step 780.

When, at step 755, the new PO+ph is determined by the controller 110 to be less than POnom, the new PO+ph is stored in the controller 110 as a prior PO−ph and the setting of the phase control circuit 305 of the second adjustable PA 300 is incremented down at step 905 (FIG. 9) by the first predetermined increment. Next, the power output is read as a new PO−ph by the controller 110 at step 910, and when the new PO−ph is determined by the controller 110 to be greater than or equal to the prior PO−ph at step 915, the new PO−ph is stored as the prior PO−ph and the setting of the phase control circuit 305 is incremented down again by the first predetermined amount at step 905. When the new PO−ph is determined by the controller 110 to be less than the prior PO−ph at step 915, the power output is read as PO−ph and a value of the control data signal 166 which sets the phase control circuit to generate PO+ph is stored in the controller 110 as PH− at step 920. Next, the setting of the phase control circuit 305 of the second adjustable PA 300 is incremented up at step 925 by the first predetermined increment, and the power output is read as a new PO+ph at step 930. Next, when the new PO+ph is determined by the controller 110 to be less than PO−ph at step 935, the method is stopped and an error, "unable to converge" is stored in the controller 110 for later reference. When the new PO+ph is determined by the controller 110 to be greater than or equal to PO−ph at step 935, the setting of the phase control circuit 305 of the second adjustable PA 300 is incremented up at step 940 by twice the predetermined increment, which is 5% of the maximum in accordance with the preferred embodiment of the present invention. Next, the power level of the P/A output 391 is read as a new PO+ph at step 950. Next, when the new PO+ph is greater than PO−ph at step 955, the setting of the phase control circuit 305 is incremented up again by the second predetermined amount at step 945. When PO+ph is less than or equal to PO−ph at step 955, the power output is read as PO+ph and a value of the control data 166 which sets the phase control circuit to generate PO+ph is stored in the controller 110 as PH+ at step 960. Next, the controller 110 determines a setting, PHPA#N of the phase control circuit 305 by PHPA#N=PH−+(PH+−PH−)/2 at step 760 (FIG. 7), and the method proceeds as described above.

It will be appreciated that the convergence of the setting of the gain to within a predetermined amount achieved at steps 665 to 675 (FIG. 6) can be accomplished by other well known numerical methods. Also, the convergence of the setting of the phase to within a predetermined amount achieved at steps 735 to 755 (FIG. 7), at steps 805 to 860 (FIG. 8), at steps 905–960 (FIG. 9), and at step 760 can be accomplished by other well known numerical methods. It will also be appreciated that the predetermined amounts used to establish the completion of the methods (3% of the maximum gain setting and 2.5% of the maximum phase setting) can have alternative values selected for better suitability to situations wherein, for example, the shape of the phase characteristic 410 is different, or where faster convergence can be traded off for less accurate convergence.

By now it should be appreciated that there has been provided an RF power amplifier which is self adjusting and from which costly cables and precision factory adjustment have been eliminated.

We claim:

1. A self adjusting multistage radio frequency power amplifier (RFPA) apparatus, comprising:
   a multistage radio frequency power amplifier (RFPA), comprising:
   an N-way RF splitter having a splitter input and N splitter outputs;
   an N-way RF combiner having N combiner inputs and a combiner output;
   N radio frequency power amplifier (RFPA) stages coupled in parallel to the N-way RF splitter and to the N-way RF combiner, wherein each of the N RFPA stages comprises an adjustable power amplifier (PA) having a PA input coupled to one of the N splitter outputs, a PA output coupled to one of the N combiner inputs, a gain control input for adjusting an RF gain of the PA output, a phase control input for adjusting an RF phase change between the PA input and PA output, and an on-off control input for turning the PA output on and off; and a power sense stage, coupled to the combiner output, which generates a forward power sense signal based on a forward power measured at the combiner output, wherein the self adjusting multistage RFPA apparatus further comprises:

a transmit input stage having a low level RF output coupled to the splitter input, wherein said transmit input stage generates a predetermined test signal at the low level RF output in response to a test modulation signal at a modulation input; and a controller coupled to the gain control input, the phase control input, and the on-off control input of each adjustable PA, to the modulation input of the transmit input stage, and to the power sense stage, wherein said controller is for optimizing at least one of a gain match and a phase match of the multistage RFPA by adjusting one of a corresponding gain control signal and a phase control signal coupled to a corresponding one of the gain control input and the phase control input of each adjustable PA in response to the forward power sense signal while said controller generates the test modulation signal.

2. The self adjusting multistage RFPA apparatus according to claim 1, wherein each of the N RFPA stages further comprises:

an input cable coupling one of the N splitter outputs to the PA input; and an output cable coupling the PA output to one of the N combiner inputs.

3. The self adjusting multistage RFPA apparatus according to claim 1, wherein the power sense stage further comprises:

a directional coupler, coupled to the combiner output, for generating a forward power proportional signal based on the forward power; and a power sensor, coupled to the dual directional coupler, for generating the forward power sense signal based on the forward power proportional signal.

4. The self adjusting multistage RFPA apparatus according to claim 1, wherein the RF phase change is adjustable over a minimum range of 360° degrees.

5. The self adjusting multistage RFPA apparatus according to claim 1, wherein the RF gain is adjustable over a minimum range of 30 db.

6. The self adjusting multistage RFPA apparatus according to claim 1, wherein the on-off control input of each of the N RFPA stages comprises a power supply input, and wherein the multistage RFPA further comprises N power sources, wherein each of the N power sources is coupled to a power control output of the controller and to the power supply input of one of the N RFPA stages, and wherein the PA output is turned on and off in response to the power control output.

7. The self adjusting multistage RFPA apparatus according to claim 1, wherein the controller comprises a phase optimizing element, coupled to the transmit input stage, the phase control input of each adjustable PA, and the power sense stage, and wherein the phase optimizing element is for generating the test modulation; identifying a first of the N RFPA stages as a reference stage; selecting a second of the N RFPA stages as a test stage; turning off the PA output of the adjustable PA of each of the N RFPA stages except the reference and test stages; and adjusting the phase control signal coupled to a phase control input of the adjustable PA of the test stage until the forward power sensed by the power sense stage is determined to be at a maximum value.

8. The self adjusting multistage RFPA apparatus according to claim 1, wherein the controller comprises a gain optimizing element, coupled to the transmit input stage, the gain control input of each adjustable PA, and the power sense stage, and wherein the gain optimizing element is for generating the test modulation signal; identifying a lowest power RFPA stage which generates a minimum forward power in response to the predetermined test signal; and setting the PA output of all of the N RFPA stages to the minimum forward power by adjusting a gain control signal coupled to the gain control input of each of the N RFPA stages until the forward power sensed by the power sense stage equals the minimum forward power.

9. The self adjusting multistage RFPA apparatus according to claim 8, wherein the gain optimizing element comprises a minimum power element for identifying the lowest power RFPA stage by selecting each of the N RFPA stages in turn and recording a forward power generated by a selected RFPA stage and sensed by the power sense stage, while the PA output of the N RFPA stages which are not the selected RFPA stage are turned off; and identifying the lowest power RFPA stage as one of the N RFPA stages which is associated with a minimum forward power.

10. The self adjusting multistage RFPA apparatus according to claim 9, wherein the gain optimizing element comprises a gain adjustment element for setting the PA output of all of the N RFPA stages by selecting each of the N RFPA stages in turn and setting the PA output of a selected RFPA stage by adjusting the gain control signal coupled to the gain control input until the forward power sensed by the power sense stage equals the minimum forward power while the PA output of the N RFPA stages which are not the selected RFPA stage are turned off.

11. A method for use in a self adjusting multistage radio frequency power amplifier (RFPA) for optimizing a phase match between stages of the multistage RFPA, wherein the self-adjusting multistage RFPA includes an N-way RF splitter, an N-way RF combiner, N RFPA stages coupled in parallel to the N-way RF splitter and to the N-way RF combiner, a power sense stage coupled to an output of the N-way RF combiner, a transmit input stage coupled to an input of the N-way RF splitter, and a controller coupled to the N RFPA stages, the transmit input stage, and the power sense stage, and wherein each of the N RFPA stages includes an adjustable power amplifier (PA), said method comprising the steps of:

generating a predetermined test signal which is coupled to the input of the N-way RF splitter from the transmit input stage;

identifying a first of the N RFPA stages as a reference stage;

selecting a second of the N RFPA stages as a test stage;

turning off a PA output of the adjustable PA of each of the N RFPA stages except the reference and test stages;

adjusting a phase control signal coupled to a phase control input of the adjustable PA of the test stage until a forward power sensed by the power sense stage is determined to be at a maximum value; and repeating said steps of selecting, turning off, and adjusting until all N RFPA stages except the reference stage have been adjusted.

12. A method which is for use in a self adjusting multistage radio frequency power amplifier (RFPA) stage for optimizing a gain match between stages of the multistage RFPA, wherein the multistage RFPA includes an N-way RF splitter, an N-way RF combiner, N RFPA stages coupled in parallel to the N-way RF splitter and to the N-way RF combiner, a power sense stage coupled to an output of the N-way RF combiner, a transmit input stage coupled to an input of the N-way RF splitter, and a controller coupled to the N RFPA stages, the transmit input stage, and the power sense stage, and wherein each of the N RFPA stages includes an adjustable power amplifier (PA) having a gain control input for adjusting a power output of the adjustable PA, said method comprising the steps of:

generating a predetermined test signal which is coupled to the input of the N-way RF splitter from the transmit input stage;

identifying a lowest power RFPA stage, which generates a minimum forward power in response to the predetermined test signal, wherein the forward power is determined from a forward power sense signal generated by the power sense stage; and setting the power output of one of the N RFPA stages to the minimum forward power by adjusting a gain control signal coupled to the gain control input of the adjustable PA of the one of the N RFPA stages until a forward power sensed by the power sense stage equals the minimum forward power, while turning off the PA output of the adjustable PA of all of the N RFPA stages except the one of the N RFPA stages; and repeating said step of setting until all N RFPA stages except the reference stage have been adjusted.

13. A method according to claim 12, wherein the step of identifying the lowest power RFPA stage comprises the steps of:

selecting one of the N RFPA stages as a test stage;

turning off the PA output of the adjustable PA of each of the N RFPA stages except the test stage;

recording a forward power generated by the test stage in response to the predetermined test signal and measured by the power sense stage, and associating the forward power with the test stage;

repeating said steps of selecting, turning off, and recording until forward powers of all N RFPA stages are recorded; and identifying as the lowest power RFPA stage one of the N RFPA stages which is associated with a minimum forward power recorded in said step of recording after said step of repeating.

\* \* \* \* \*